United States Patent [19]

Braden

[11] 4,395,184

[45] Jul. 26, 1983

[54] MEANS AND METHOD FOR PROCESSING MINIATURE ELECTRONIC COMPONENTS SUCH AS CAPACITORS OR RESISTORS

[75] Inventor: Denver Braden, Carlsbad, Calif.

[73] Assignee: Palomar Systems & Machines, Inc., Escondido, Calif.

[21] Appl. No.: 123,201

[22] Filed: Feb. 21, 1980

[51] Int. Cl.³ .......................... H05K 3/30; B65G 65/04
[52] U.S. Cl. ........................................ 414/417; 29/759
[58] Field of Search ............... 414/417; 220/448, 461; 29/759, 760; 269/227; 206/0.83, 489

[56] References Cited

U.S. PATENT DOCUMENTS

| | | | |
|---|---|---|---|
| 2,258,535 | 10/1941 | Buronelli | 206/489 |
| 2,366,886 | 1/1945 | Van Tuyl | 414/417 |
| 2,386,076 | 10/1945 | Taylor et al. | 414/417 |
| 2,961,900 | 11/1960 | Stanton et al. | 269/227 |
| 3,178,014 | 4/1965 | Goldwasser | 206/0.83 |

Primary Examiner—Lawrence J. Oresky
Attorney, Agent, or Firm—Oliver D. Olson

[57] ABSTRACT

Miniature electronic component parts such as capacitors or resistors are end conductively coated by use of a part handling plate having a multiplicity of passageways therethrough with walls coated by resilient material to grip the parts. A bank of pins in a press (a) are used to move the parts in the passageways, (b) are used to load the parts into the passageways through the use of a loading plate housing part receiving openings filled with parts by the use of vibration equipment, and (c) are used to discharge the parts from the passageways into the recesses of an unloading plate. The parts are moved in the passageways first to expose one end to be coated and then second to expose the other end of the parts to be coated.

16 Claims, 14 Drawing Figures

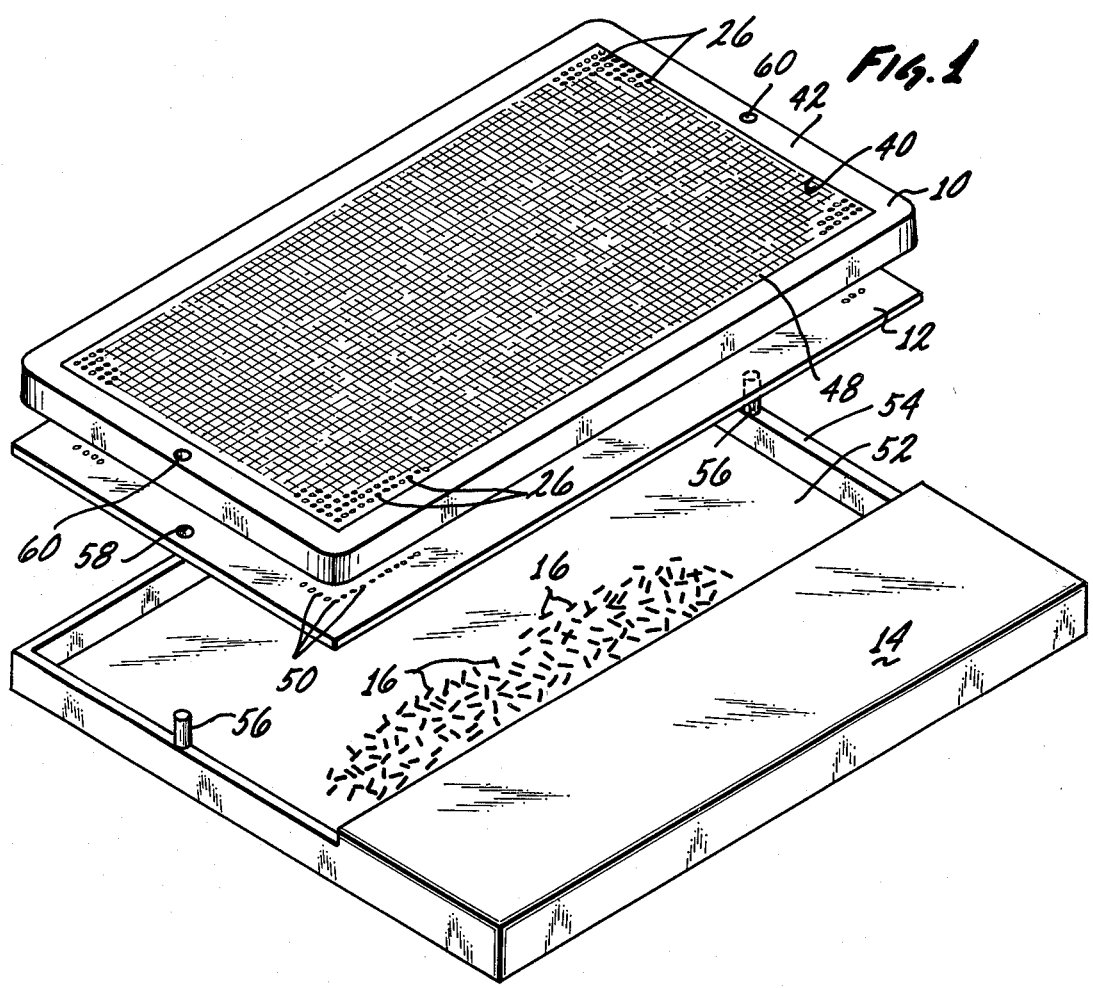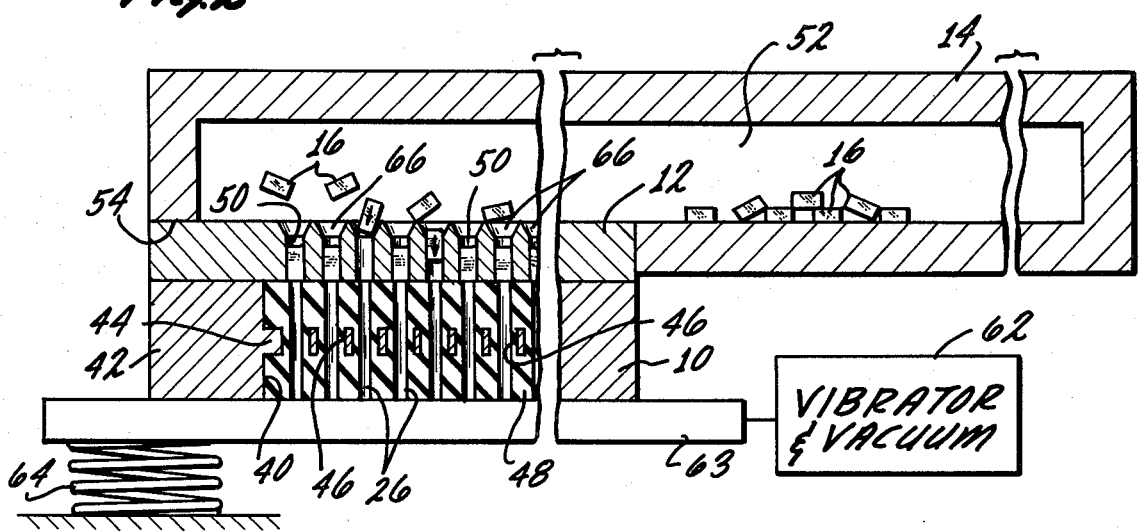

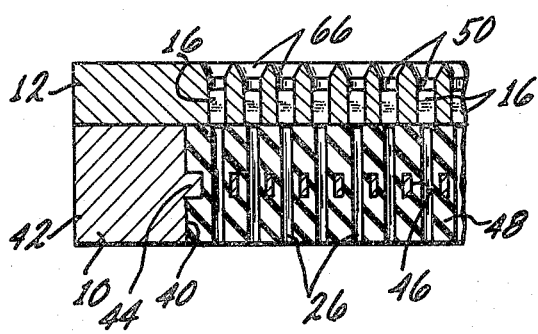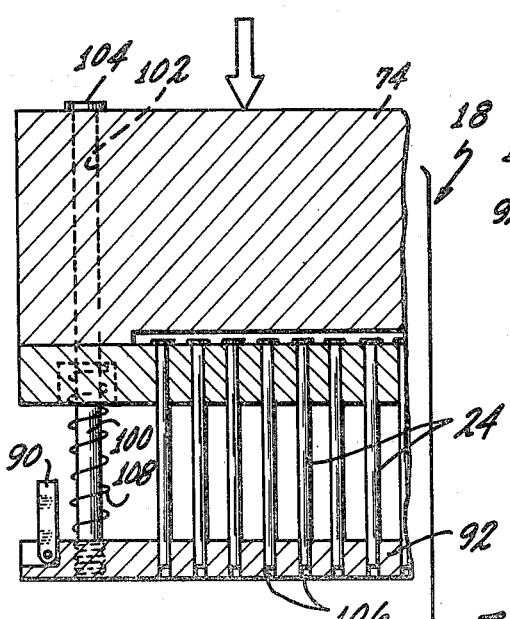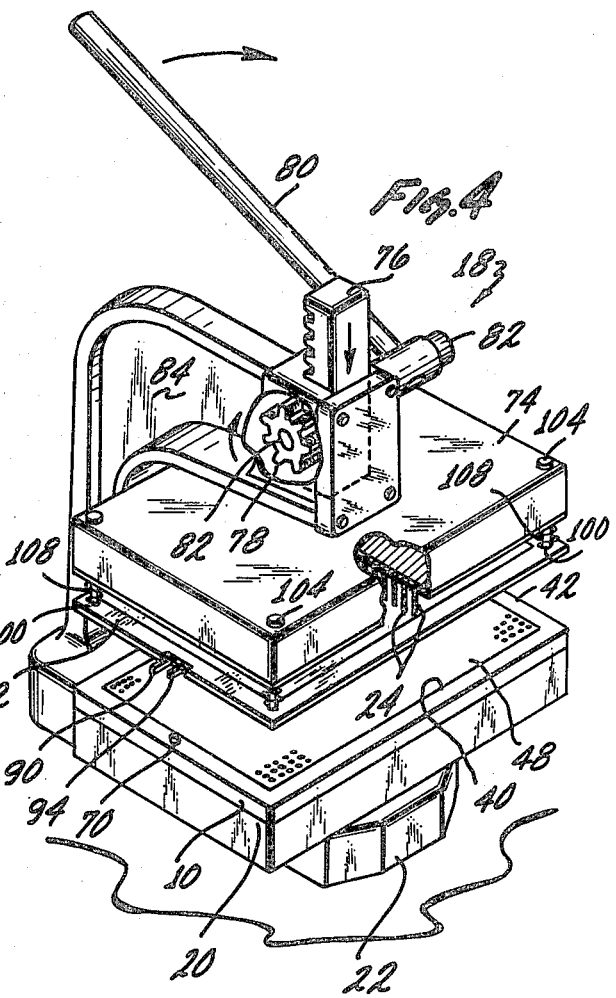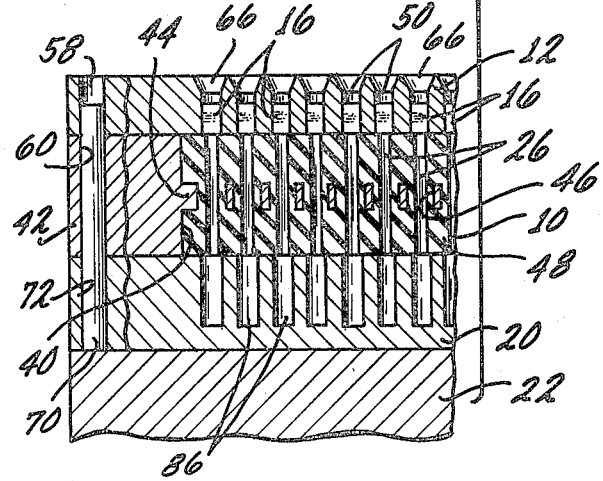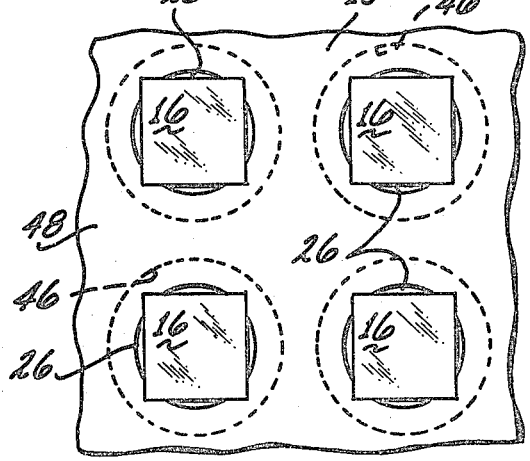

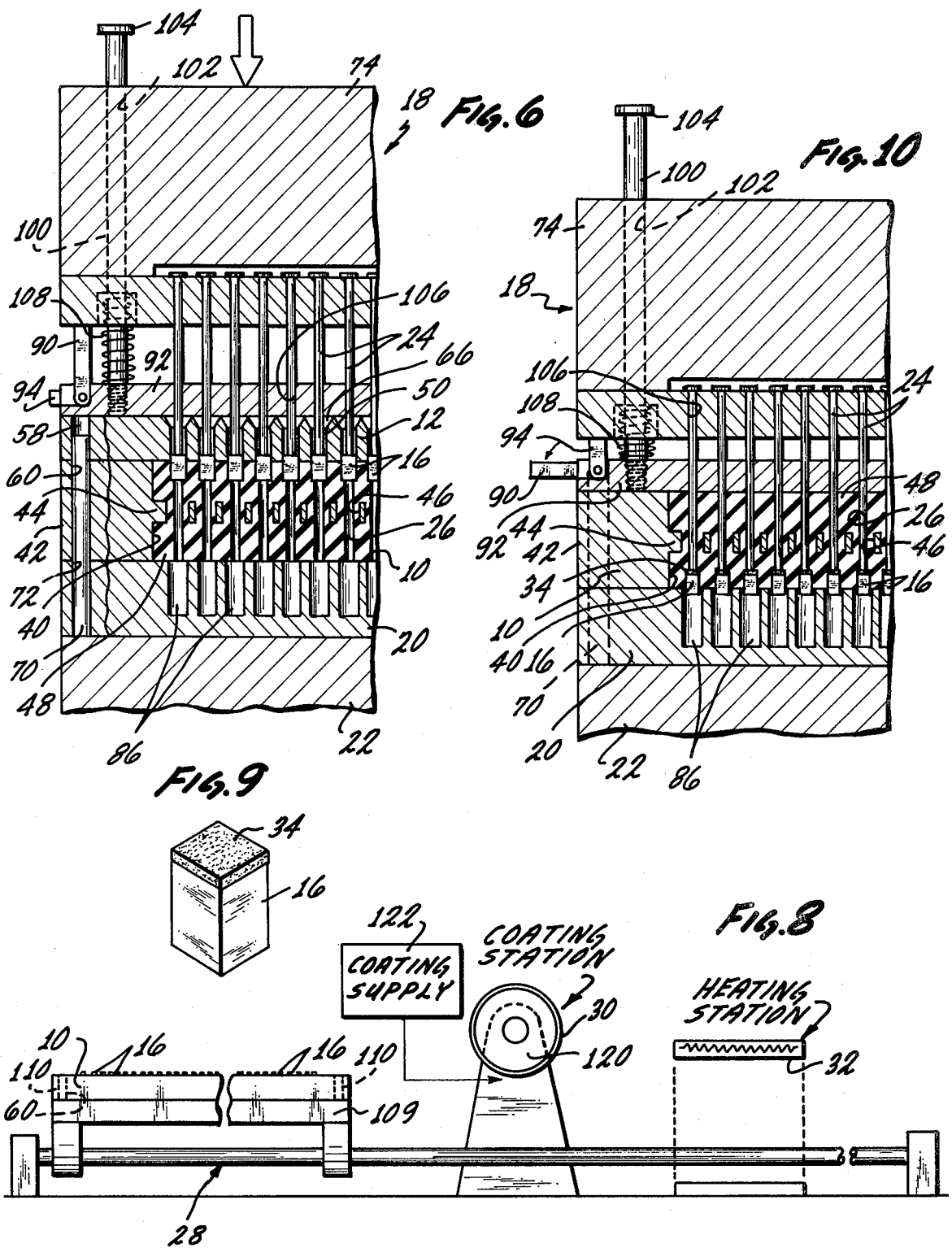

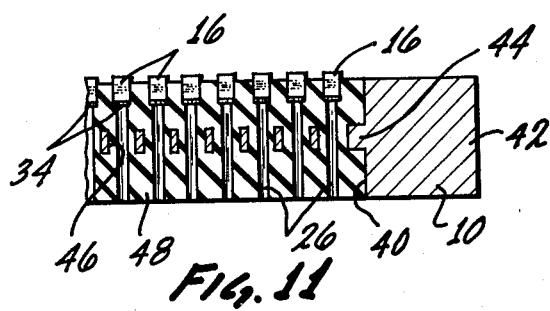
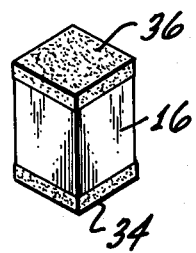
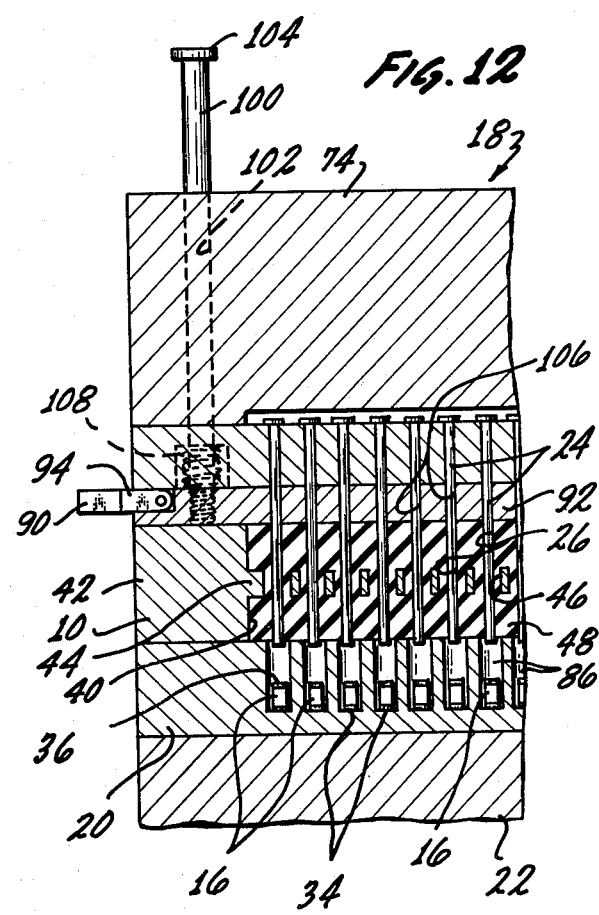
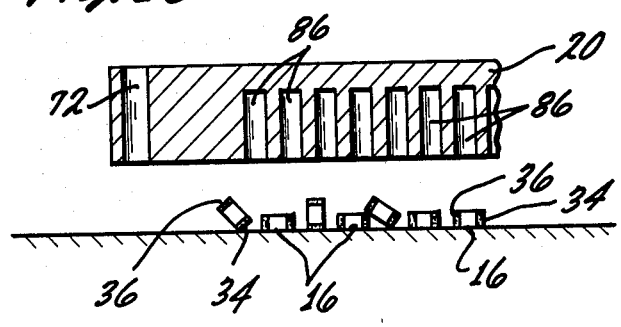

MEANS AND METHOD FOR PROCESSING MINIATURE ELECTRONIC COMPONENTS SUCH AS CAPACITORS OR RESISTORS

BRIEF SUMMARY OF THE INVENTION AND OBJECTIVES

My invention relates to a means and method of processing miniature capacitors or the like useful in applying a conductive coating to the ends thereof.

A preliminary examination search was made on the invention which resulted in the citing of the following patents by the searcher:

U.S. Pat. No. 4,131,982 3,785,035 3,896,654 4,089,105 3,710,479 3,851,223 3,963,456 3,727,284 3,896,451

I was not familiar with the specific devices shown in these patents. I do not believe the patents show the inventions claimed herein.

In processing such miniature components, the following features are desirable to be achieved, among others:

(a) To process parts economically in terms of time and cost, i.e., to process parts in batches of hundreds in each operation.
(b) To produce as few defective parts as is feasible and to readily detect defects.
(c) To utilize relatively economical, low maintenance, easily operated, long life equipment.

It is an object of my invention to provide a method and means to process such components having the above features. Time saving is a primary advantage of my method and equipment.

My invention will be best understood, together with additional objectives and advantages thereof, from the following description, read with reference to the drawings, in which:

THE DRAWINGS

FIG. 1 is an exploded perspective view of a specific embodiment of some of the equipment used in my invention.

FIG. 2 is a fragmentary vertical sectional view, on enlarged scale, showing partly the same equipment as FIG. 1.

FIG. 3 is a partial vertical sectional view.

FIG. 4 is a perspective view. Certain structure is broken away to reveal structure otherwise hidden.

FIG. 5 is a partial vertical sectional view.

FIG. 6 is a view like FIG. 5 but with some parts in different positions.

FIG. 7 is an enlarged, fragmentary plan view.

FIG. 8 is an elevational schematical representation of some processing equipment.

FIG. 9 is an enlarged perspective view of an electronic component with a coating on one end.

FIG. 10 is a view like FIGS. 5 and 6 with some parts in different positions.

FIG. 11 is a fragmentary vertical section showing an inverted part handling plate.

FIG. 12 is a view like FIGS. 5, 6 and 10 but with some parts in different positions.

FIG. 13 is a partial sectional view of parts being unloaded from a part unloading plate.

FIG. 14 is like FIG. 9 but showing a coating on both ends of the electronic components.

DETAILED DESCRIPTION

The purpose of the processing and equipment is to conduct certain operations on parts, especially to apply to the ends of a miniature electronic component 16, in sequence, coatings 34, 36. FIG. 9 shows the part with coating 34 and FIG. 14 shows the addition of coating 36.

Part 16 could be a chip capacitor or a resistor for example. In size, an example would be around 1/16×1/16" in cross-section and 3/32 to 5/32" long but the part could be larger or smaller than that. The construction of such a miniature capacitor or resistor will be understood by those skilled in the art. A capacitor, for example, has a sizable number of conductive layers separated by non-conductive layers. Conductive layers are interfingered as to electrical connection of layers to opposite ends of part 16. In any case, such miniature part 16 needs to have conductive coatings applied to opposite ends and my invention concerns that operation.

The drawings show sequence of operations. FIG. 1 includes, from top to bottom, a part handling plate 10, a part loading plate 12, and a part feeding body 14. FIG. 2 adds schematically the functions of vibration, vacuum and spring mount to the FIG. 1 parts to load parts in plate 12. FIG. 3 shows part loading plate 12 and part handling plate 10 with electronic components 16 in place in plate 12.

FIG. 4 shows part punching means 18 used (a) to transfer parts 16 from part loading plate 12 to part handling plate 10, (b) used to transfer parts 16 from one side to the other side of part handling plate 10, and used to unload parts 16 from part handling plate 10.

FIG. 5 shows a step in the sequence of operations involving part pushers means 18. A bank of punches 24 is shown in the upper part of the view, and plates 10, 12, a part unloading plate 20, and part punching base 22 are shown in the lower part of the view. FIG. 6 is like FIG. 5 but with the punches 24 of part pushers means 18 in the process of punching parts 16 out of part loading plate 12 and into part handling plate 10. The ends of parts 16 are exposed above the upper face of plate 10.

The method of handling parts 16 shown involves resiliently gripping parts in the part receiving passageways 26 in part handling plate 10. FIG. 7 illustrates resilient gripping of parts. Parts 16 usually are right-rectangular (square or rectangular in cross-section) whereas passageways 26 are round and normally have a diameter less than the maximum cross-sectional dimension of parts 16. The walls of passageways 26 are resiliently coated to accommodate and grip parts 16.

FIG. 8 shows equipment for processing a part handling plate 10 having the ends of electronic components 16 exposed above its upper face. The equipment includes conveying means 28, part coating equipment 30, and part heating equipment 32, used to coat ends of parts 16 and to bake such coatings. FIG. 9 shows coating 34 applied to a first end of a part 16.

FIG. 10 is like FIG. 6 but with part handling plate 10 inverted, after applying coating 34 and returning plate 10 to part punching press 18. Parts 16 are being moved by pushers 24 into position exposing their second ends beyond the second face of plate 10, so that the second ends can be coated. FIG. 11 shows plate 10 inverted from its FIG. 10 position with the second ends of the parts 16 exposed, ready to run through the FIG. 8 coating equipment.

FIG. 12 shows part punching press 18 in the process of unloading parts from plate 10 into part unloading plate 20. FIG. 13 shows parts 16 being dumped out of plate 20. FIG. 14 shows part 16 with a coating 36 on its second end in addition to coating 34 on its first end.

The foregoing description describes some of the principal operations and equipment involved in my invention. I will now review them in more detail.

A basic part of my processing system is part handling plate 10. It has a multiplicity of part receiving passageways 26 having walls coated with resilient material. I will now describe my preferred structure of plate 10. It is formed of metal with a recess 40 in each face extending throughout the major portions of the face to the marginal areas 42. This leaves a central web 44 of metal which has a multiplicity of bores 46. A resilient plastic material 48 is used to fill recesses 40 and bores 46 except for leaving part receiving passageways 26. Material 48 provides resilient walls for passageways 26, to receive and grip parts in the manner particularly illustrated in FIG. 7. The material 48 can be selected from various applicable plastics or rubbers. An example is a pliable silicone rubber. Those skilled in the art will understand the selection of applicable materials and methods, tooling, etc., to form plate 10. In the claims when material 48 is described as "resilient plastic" that term is defined to include plastics or natural or artificial rubbers which are suitable for the usage. The purpose of having recesses 40 (rather than merely to coat bores 46) is to better hold the plastic material 48 in place.

Parts 16 usually will be square or rectangular in cross-section. Even if the parts 16 were circular in cross-section, the action of the walls of passageways 26 in gripping parts 16 would be similar, i.e., the diameter of passageways 26 should be less than the maximum lateral dimension of parts 16.

The basic method of handling parts 16 in passageways 26 consists of (a) inserting the parts into the passageways, (b) moving the parts so first ends are exposed beyond the face of plate 10, i.e., FIGS. 6 and 8, and (c) moving parts 16 so the second ends are exposed beyond the second face of plate 10, i.e., FIGS. 10 and 11. The exposed ends of parts 16 are coated by the equipment shown in FIG. 8 after steps (b) and (c) above.

I will now deal with the insertion of parts 16 into passageways 26 of part handling plate 10. The part loading plate 12 and the part feeding body 14 and the use of vibration and vacuum to insert parts 16 in the holes 50 of plate 12 follow practices used before in the prior art. Somewhat similar equipment and processes are utilized in some of the patents identified in the earlier part of this specification.

Part receiving body 14 has a hopper cavity 52 which receives the electronic components 16 in bulk. An open face 54 of cavity 52 is covered by part loading plate 12 and part handling plate 10 that are oriented by alignment pins 56 on body 14 which extend through alignment openings 58, 60 in plates 12, 10 respectively. Components 16 are loaded in cavity in the manner demonstrated in FIG. 1. Then the assembly is inverted as shown in FIG. 2. As the application of vibration and vacuum 62 to a vibrator base 63 and the use of suitable spring mounts 64 for base 63 are old and familiar expedients in the art to load parts in a plate like part loading plate 12, I will only observe that vacuum is applied to the lower ends of passageways 26 to help fill holes 50 in plate 12 with parts 16 as the assembly is being vibrated. Following common practices, holes 50 are slightly larger than parts 16 but not so large that they will fit in any way but with their longitudinal axis vertical, so that they will be presented in end-forward directions to passageways 26. The upper ends 66 of holes 50 are flared to more readily receive parts 16. Holes 50 could be circular or rectangular in cross-section as the only orientation required of parts 16 is that they be presented in an end-forward direction. The action of filling holes will be slightly faster if holes 50 are circular in cross-section. To give an example, 2145 holes 50 were 100% filled with parts 16 in 8–10 seconds.

Part punching means 18 is a form of press and includes a base 22 having upstanding alignment pins 70 that fit into alignment openings 72 in part unloading plate 20, into alignment openings 60 in part handling plate 10 and into alignment openings 58 in part loading plate 12 to hold the plates in proper alignment.

The upper parts of press 18 include an upper plate 74, a rack 76 upstanding from plate 74, a pinion 78 engaged with rack 76, and a pivotally mounted handle 80 secured to a common shaft 82 with pinion 78 and rotating pinion 78 when handle 80 is manually pivoted to force upper plate 74 up and down. The bearing for shaft 82 is supported by an arm 84 upstanding from base 22.

Suitably mounted on upper press plate 74 in depending position is a bank of pin pushers 24 mating with openings 50 in part loading plate 12, mating with passageways 26 in part handling plate 10, and mating with a multiplicity of recesses 86 in part unloading plate 20. As handle 80 is operated, parts 16 are forced from positions in holes 50 of plate 12 into passageways 26 in plate 10. The first position of parts 16 in passageways 26 is shown in the sequence of FIGS. 5–6 to leave the upper ends of parts 16 in a plane above the upper face of plate 10 so that they can be coated. Stop 90 pivotally mounted on stripper plate 92 can be positioned upright to stop upper plate 74 when pins 24 have so oriented the ends of parts 16 in the FIG. 6 position.

The second position of parts 16 in passageways 26 is shown in FIG. 10 with the second ends of parts 16 disposed in a plane below the lower face of plate 10 in position to be coated. A second stop 94 pivotally mounted on stripper plate 92 can be positioned in upright position to stop upper press plate 74 when the FIG. 10 position of the ends of parts 16 is reached. Two FIG. 10 type operations can be substituted for a FIG. 6 and a FIG. 10 type operation, i.e., if a FIG. 10 operation is conducted and then the plate 10 is inverted and the operation repeated, both ends of parts will have been disposed in position to be coated.

Stripper plate 92 is supported on upper press plate 74 by rods 100 slidably mounted in openings 102 in plate 74 and secured to stripper plate 92. The enlarged ends 104 of rods 100 act as abutments limiting downward movement of stripper plate 92 relative to upper press plate 74 to a position preferably covering the lower ends of pins 24, as in FIG. 5. Plate 92 has openings 106 mating with pins 24. Compression springs 108 on rods 100 between upper press plate 74 and stripper plate 92 normally urge stripper plate 92 to the FIG. 5 lower position covering pins 24. The purposes of stripper plate 92 include (a) to normally cover and protect pin pushers 24 during insertion and removal of plates 10, 12, 20, and (b) to strip part handling plate 10 from the bank of pins 24 when the press 18 is opening, as otherwise the resilient walls of passageways 26 may grip pins 24 and plate 10 may therefore tend to raise with upper press plate 74.

Part handling plate 10 is removed from press 18 after the FIG. 5–6 sequence to apply coating 34 to the first end of electronic components 16, and after the FIG. 10 operation to apply coating 36 to the second ends of components 16 exposed as illustrated in FIG. 11. The equipment shown in FIG. 8 demonstrates state-of-the-art coating equipment 30 and ovens 32, so I have shown the equipment schematically.

Plate 10 is shown schematically to be mounted on a traveling platform 109 having upstanding pins 110 fitting in alignment holes 60 in plate 10 to secure it in position. The conveying means 112 (implicitly a screw mechanism) actually would not be common to both coating station 30 and oven 32, i.e., the ends of parts 16 first would be coated and then the plate 10 would be placed on a conveyor of an oven.

As indicated, the coating mechanism 30 is of a common type having a metal roller 120, usually having a doctor blade (not shown) controlling the amount of coating passing onto roller 120 and then onto the ends of parts 16, and having a reservoir function 122 in supplying the coating material to the roller/doctor blade mechanism.

I will not further describe the coating and baking functions in applying conductive metalized coatings 34,36 to the ends of capacitors or resistors 16. The type of coating will follow state-of-the-art materials such as a fine milled silver compound in a resin base cured by heating in an oven.

My process of orienting the parts for processing by the equipment represented in FIG. 8 represents high efficiency in time consumed. Using the equipment shown in FIGS. 1 and 2, the example of time given before is inserting about 2000 parts 16 in openings 50 in part loading plate 12 in about eight to ten seconds. In the process of the FIGS. 5–6 operation getting ready to coat the parts with the FIG. 8 equipment, an example is about five seconds. To orient parts 16 in press 18 the second time (FIG. 10), again would involve around five seconds. Silvering the first or second ends of parts 16 can be accomplished in about ten seconds. Curing the coating in an oven takes about two and a half minutes. After coating and firing, inspection can be accomplished merely by glancing at plate 10, as any uncoated ends of parts 16 would be quite evident. However, it is rare to have an uncoated part 16.

Unloading of parts 16 from passageways 26 of plate 10 into recesses 86 in unloading plate 20, as demonstrated in FIG. 12, is another ten second type operation. FIG. 13 indicates unloading of plate 20.

Having thus described my invention, I do not want to be understood as limiting myself to the exact details described. Instead, I wish to cover those modifications of my invention that will occur to those skilled in the art upon learning of my invention and which properly fall within the scope of my invention.

I claim:

1. Means to handle miniature electronic parts such as capacitors, resistors or the like, comprising:
   (a) part pushing means having support means and having a bank of juxtaposed pushers secured together to move as a unit and said pushers facing said support means, and said pushing means having means operative to force said bank of pushers toward said support means,
   (b) a part handling plate having a plate-like body having a multiplicity of juxtaposed passageways extending from face to face of said body, said passageways having resilient walls whereby when said passageways are slightly smaller in cross-section than the cross-section of the parts to be supported thereby, the passageways will resiliently grip the parts, said plate being disposed between said bank of pushers and said support means and said passageways being aligned with said pushers, whereby said pushers may be forced into said passageways to force parts disposed in said passageways into locations with the ends of the parts oriented relative to a face of said plate-like body in position to be operated upon, and
   (c) a part unloading plate disposed on said support means between said part handling plate and said support means and said part unloading plate having a multiplicity of recesses in its face toward said part handling plate matching the locations of said passageways whereby parts can be unloaded from said passageways by forcing said parts with said pushers out of said passageways and into said recesses whereupon said part unloading plate can be removed from said support means to dump said parts.

2. Means to handle miniature electronic parts such as capacitors, resistors or the like, comprising:
   (a) part pushing means having support means and having a bank of juxtaposed pushers secured together to move as a unit and said pushers facing said support means, and said pushing means having means operative to force said bank of pushers toward said support means,
   (b) a part handling plate having a plate-like body having a multiplicity of juxtaposed passageways extending from face to face of said body, said passageways having resilient walls whereby when said passageways are slightly smaller in cross-section than the cross-section of the parts to be supported thereby, the passageways will resiliently grip the parts, said plate being disposed between said bank of pushers and said support means and said passageways being aligned with said pushers, whereby said pushers may be forced into said passageways to force parts disposed in said passageways into locations with the ends of the parts oriented relative to a face of said plate-like body in position to be operated upon,
   (c) a part unloading plate disposed on said support means between said part handling plate and said support means and said part unloading plate having a multiplicity of recesses in its face toward said part handling plate matching the locations of said passageways whereby parts can be unloaded from said passageways by forcing said parts with said pushers out of said passageways and into said recesses whereupon said part unloading plate can be removed from said support means to dump said parts, and
   (d) a limiting stop that can be selectively used to limit movement of said pushers in said passageways to part locations in which the parts are disposed in said passageways with one end of each part extending beyond the corresponding face of said plate-like body and into a corresponding recess of said part unloading plate so that the ends of said parts exposed out of said passageways can be coated when said part handling plate is removed from said part pushing means.

3. Means to handle miniature electronic parts such as capacitors, resistors or the like, comprising:
   (a) part pushing means having support means and having a bank of juxtaposed pushers secured together to move as a unit and said pushers facing said support means, and said pushing means having means operative to force said bank of pushers toward said support means, (b) a part handling plate having a plate-like body having a multiplicity of juxtaposed passageways extending from face to face of said body, said passageways having resilient walls whereby when said passageways are slightly smaller in cross-section than the cross-section of the parts to be supported thereby, the passageways will resiliently grip the parts, said plate being disposed between said bank of pushers and said support means and said passageways being aligned with said pushers, whereby said pushers may be forced into said passageways to force parts disposed in said passageways into locations with the ends of the parts oriented relative to a face of said plate-like body in position to be operated upon, (c) a limiting stop that can be selectively used to limit movement of said pushers in said passageways to part locations in which the parts are disposed in said passageways with one end of said part extending beyond the corresponding face of said plate-like body toward said support means so that the ends of said parts exposed out of said passageways can be coated when said part handling plate is removed from said part pushing means, and (d) a part loading plate disposed between said bank of pushers and said part handling plate and having a multiplicity of openings therethrough corresponding to the locations of said passageways, whereby said bank of pushers can be used to force parts in said openings of said part loading plate into said passageways, and a second limiting stop that can be selectively used to limit movement of said pushers to part locations in which all but one end of each part is disposed in said passageways whereby the ends of said parts exposed out of said passageways and remaining in said openings of said part loading plate can be coated when said part handling plate is removed from said part pushing means.

4. Means handling a multiplicity of identical miniature electronic parts such as capacitors, resistors or the like, comprising:

(a) a part-handling plate having a plate-like body with a multiplicity of juxtaposed through passageways extending from face to face of said body and each passageway having one of said parts disposed therein, (b) each passageway having a dimension smaller than the corresponding dimension of the part disposed therein and each passageway having walls formed of resilient material, the resilient material extending substantially from face to face of said body so that each part is continuously resiliently gripped by said resilient walls of the passageway containing the same in all of the various positions of the part including a first position in which one surface of the part therein is exposed to be coated at one face of said body and including a second position in which an opposite surface of the part is exposed to be coated at the other face of said body, and (c) part pushing means having a bank of juxtaposed pushers secured together and means supporting said body facing said bank of pushers, one pusher being aligned with each of said passageways, and said bank of pushers and said body being relatively movable to push said parts in said passageways to said first and second positions and to push said parts completely out of said passageways to unload the parts, and operating means operative to relatively move said bank of pushers and said body.

5. The subject matter of claim 4 in which said parts are rectangular in cross-section and said passageways are circular in cross-section, the distances between opposite corners of the rectangular part cross-section being greater than the diameter of the circular passageway cross-section whereby said passageways grip said parts.

6. The subject matter of claim 4 in which said plate-like body has a metal portion and a multiplicity of bores through said metal portion, there being one bore associated with each passageway which is centered therein and resilient plastic filling said bores except for forming said passageways, said resilient plastic forming said resilient walls of said passageways, said resilient plastic extending from face to face of said body.

7. The subject matter of claim 4 in which said plate-like body has a planar recess in each face extending throughout all but marginal areas thereof and said plate-like body has a multiplicity of rows and files of juxtaposed bores extending therethrough in the areas of said recesses, resilient plastic filling said recesses and said bores except for forming said passageways which are centered in said bores, the length of said passageways being greater than the length of said parts, said body being formed of metal except for said plastic filling said bores and recesses.

8. The subject matter of claim 4 in which there is a stripper plate disposed between said bank of pushers and said part-handling plate, said stripper plate having a multiplicity of openings matching said pushers so that said pushers may pass through said openings, means supporting said stripper plate to move in directions toward and away from said pushers including stop means limiting movement of said stripper plate away from said pushers to a location covering the end of said pushers so that said pushers will be protected as said plate-like body is moved into and out of position between said pushers and said support means, and spring means pressing said stripper plate toward said stop means whereby when said pushers are being withdrawn from said passageways said stripper plate will tend to strip said plate-like body from said pushers.

9. The subject matter of claim 4 in which said operating means operative to force said bank of pushers toward said support means includes a rack secured to said bank of pushers, a pinion engaged with said rack, and a manually operable handle secured to said pinion to rotate the same.

10. The subject matter of claim 4 in which there is limiting stop means movable between operative and inoperative positions under manual control, said stop means in said operative position limiting the movement of said pushers relative to said passageways not to move said parts in said passageways beyond said first and second positions of said parts, said stop means in said inoperative position permitting said pushers to move in said passageways to completely eject said parts to unload the same.

11. Means for handling a multiplicity of identical miniature electronic parts such as capacitors, resistors or the like, comprising:

(a) a part-handling plate having a plate-like body with a multiplicity of juxtaposed through passageways extending from face to face of said body and each passageway being adapted to receive of said parts therein, (b) each passageway having walls formed of resilient material, the resilient material extending substantially from face to face of said body so that if each part has a larger dimension than the corresponding dimension of the associated passageway then each part will be continuously resiliently gripped by said resilient walls of the passageway containing the same in all of the various positions of the part therein including a first position in which one surface of the part is exposed to be coated at one face of said body and including a second position in which an opposite surface of the part is exposed to be coated at the other face of said body, and (c) part pushing means having a bank of juxtaposed pushers secured together and means supporting said body facing each bank of pushers, one pusher being aligned with each of said passageways, and said bank of pushers and said body being relatively movable to push said parts in said passageways to said first and second positions and to push said parts completely out of said passageways to unload the parts, and operating means operative to relatively move said bank of pushers and said body.

12. The subject matter of claim 11 in which said plate-like body has a metal portion and a multiplicity of bores through said metal portion, there being one bore associated with each passageway which is centered therein and resilient plastic filling said bores except for forming said passageways, said resilient plastic forming said resilient walls of said passageways, said resilient plastic extending from face to face of said body.

13. The subject matter of claim 11 in which said plate-like body has a planar recess in each face extending throughout all but marginal areas thereof and said plate-like body has a multiplicity of rows and files of juxtaposed bores extending therethrough in the areas of said recesses, resilient plastic filling said recesses and said bores except for forming said passageways which are centered in said bores, the length of said passageways being greater than the length of said parts, said body being formed of metal except for said plastic filling said bores and recesses.

14. The subject matter of claim 11 in which there is a stripper plate disposed between said bank of pushers and said part-handling plate, said stripper plate having a multiplicity of openings matching said pushers so that said pushers may pass through said openings, means supporting said stripper plate to move in directions toward and away from said pushers including stop means limiting movement of said stripper plate away from said pushers to a location covering the ends of said pushers so that said pushers will be protected as said plate-like body is moved into and out of position between said pushers and said support means, and spring means pressing said stripper plate toward said stop means whereby when said pushers are being withdrawn from said passageways said stripper plate will tend to strip said plate-like body from said pushers.

15. The subject matter of claim 11 in which said operating means operative to force said bank of pushers toward said support means includes a rack secured to said bank of pushers, a pinion engaged with said rack, and a manually operable handle secured to said pinion to rotate the same.

16. The subject matter of claim 11 in which there is limiting stop means movable between operative and inoperative positions under manual control, said stop means in said operative position limiting the movement of said pushers relative to said passageways not to move said parts in said passageways beyond said first and second positions of said parts, said stop means in said inoperative position permitting said pushers to move in said passageways to completely eject said parts to unload the same.

* * * * *